United States Patent
Matsuo

(10) Patent No.: US 9,550,296 B2
(45) Date of Patent: Jan. 24, 2017

(54) CONVEYING APPARATUS AND CONVEYING SYSTEM WITH CANT SURFACES

(71) Applicant: DAIHEN Corporation, Osaka-shi, Osaka (JP)

(72) Inventor: Hideki Matsuo, Osaka (JP)

(73) Assignee: DAIHEN Corporation, Osaka (JP)

( * ) Notice: Subject to any disclaimer, the term of this patent is extended or adjusted under 35 U.S.C. 154(b) by 109 days.

(21) Appl. No.: 14/670,741

(22) Filed: Mar. 27, 2015

(65) Prior Publication Data

US 2015/0273699 A1    Oct. 1, 2015

(30) Foreign Application Priority Data

Mar. 31, 2014 (JP) ................. 2014-071917

(51) Int. Cl.
*H01L 21/677* (2006.01)
*B25J 11/00* (2006.01)
*B25J 15/00* (2006.01)
*B25J 5/02* (2006.01)

(52) U.S. Cl.
CPC .............. *B25J 11/0095* (2013.01); *B25J 5/02* (2013.01); *B25J 15/0014* (2013.01); *H01L 21/67706* (2013.01); *H01L 21/67742* (2013.01); *H01L 21/67748* (2013.01)

(58) Field of Classification Search
CPC ................. B25J 9/123; H01L 21/67748; H01L 21/67754; H01L 21/67739; H01L 21/67742
USPC ........................................................ 294/213
See application file for complete search history.

(56) References Cited

U.S. PATENT DOCUMENTS

| | | | | | |
|---|---|---|---|---|---|
| 3,620,524 A | * | 11/1971 | Czompi | ................... | B60J 1/005 156/391 |
| 3,883,008 A | * | 5/1975 | Castaldi | ............... | B65G 1/0435 414/269 |
| 5,980,193 A | * | 11/1999 | Clifton | .............. | H01L 21/67766 414/749.2 |
| 7,306,423 B2 | * | 12/2007 | Ogawa | ..................... | B25J 9/042 414/749.1 |
| 7,665,950 B2 | * | 2/2010 | Uratani | ................... | B25J 9/042 414/744.2 |

(Continued)

FOREIGN PATENT DOCUMENTS

JP     2005-125479     5/2005

*Primary Examiner* — Gerald McClain
(74) *Attorney, Agent, or Firm* — Hamre, Schumann, Mueller & Larson, P.C.

(57) ABSTRACT

A conveying apparatus includes a guide mechanism and a moving body guided by the guide mechanism. The moving body includes a first support, a second support and a holding portion. The first support has a first engagement portion engaged with the guide mechanism. The first support, supported by the guide mechanism, is movable in a first direction. The second support has a second engagement portion engaged with the guide mechanism. The second support, supported by the guide mechanism, is movable in the first direction. The holding portion, supported by the first and the second supports, holds a workpiece. The first engagement portion receives a moment applied thereto by deformation of the moving body, where the moment is opposite in direction to a moment applied to the first engagement portion by a load of the workpiece held by the holding portion.

9 Claims, 12 Drawing Sheets

(56) References Cited

U.S. PATENT DOCUMENTS

| | | | |
|---|---|---|---|
| 7,736,118 B2 * | 6/2010 | Uratani | B25J 9/041 |
| | | | 414/744.6 |
| 8,203,101 B2 * | 6/2012 | Miyamoto | B25J 9/107 |
| | | | 414/749.1 |
| 9,050,828 B2 * | 6/2015 | Miyazawa | B25J 5/00 |
| 9,112,385 B2 * | 8/2015 | Sakano | B25J 9/1612 |
| 2015/0123417 A1 * | 5/2015 | Patoglu | B25J 19/0091 |
| | | | 294/213 |

* cited by examiner

CONVEYING APPARATUS AND CONVEYING SYSTEM WITH CANT SURFACES

BACKGROUND OF THE INVENTION

1. Field of the Invention

The present invention relates to a conveying apparatus and a conveying system.

2. Description of Related Art

In the process of manufacturing semiconductors and manufacturing liquid crystal panels, a conveying robot that can convey workpieces in a straight line is used to convey workpieces to and from a process chamber. In recent years, due to the increasing size of semiconductor wafers and liquid crystal panels, technology for using a linear guide to convey workpieces has been proposed in order to realize an accurate linear movement process (e.g., see JP-A-2005-125479). Two linear guide rails (hereinafter, referred to as rails) placed parallel to each other are provided with blocks that can move along the rails, hands are attached to the tops of the blocks via coupling members or the like, workpieces are placed on the hands, and the workpieces are conveyed linearly.

When a workpiece is placed on a hand, a moment about the rail axial direction is applied to the block due to offset load. Accordingly, there is a possibility of the block and members in the vicinity thereof becoming damaged prematurely.

SUMMARY OF THE INVENTION

The present invention has been proposed in light of the above-described circumstances, and an object thereof is to provide a conveying apparatus whose lifetime can be extended.

A first aspect of the present invention provides a conveying apparatus including: a guide mechanism and a moving body configured to move while being guided by the guide mechanism. The moving body includes a first support, a second support and a holding portion. The first support has a first engagement portion engaged with the guide mechanism, and is supported by the guide mechanism so as to be capable of moving in a first direction. The second support has a second engagement portion engaged with the guide mechanism, and is supported by the guide mechanism so as to be capable of moving in the first direction. The holding portion is supported by the first support and the second support, and is configured to hold a workpiece. The first engagement portion is configured to receive a first opposite direction moment applied thereto by deformation of the moving body, where the first opposite direction moment is opposite in direction to a moment applied to the first engagement portion by a load of the workpiece held by the holding portion.

In an embodiment, a second opposite direction moment is applied to the second engagement portion by deformation of the moving body, where the second opposite direction moment is opposite in direction to a moment applied to the second engagement portion by a load of the workpiece held by the holding portion.

In an embodiment, the moving body is held in an elastically deformed state.

In an embodiment, the guide mechanism includes a first guide portion and a second guide portion each extending in the first direction, where the first guide portion and the second guide portion are separated from each other in a second direction orthogonal to the first direction. The first guide portion is engaged with the first engagement portion, and the second guide portion is engaged with the second engagement portion.

In an embodiment, the first support has a first support region for supporting the holding portion, where the first support region is located at a different position from the first engagement portion as viewed in a gravitational direction. Similarly, the second support has a second support region for supporting the holding portion, where the second support region is located at a different position from the second engagement portion as viewed in the gravitational direction.

In an embodiment, the guide mechanism includes a first guide portion that extends in the first direction, and the first engagement portion and the second engagement portion are both engaged with the first guide portion.

In an embodiment, the first support has a first attachment plate and a first spacer, and the second support has a second attachment plate and a second spacer. The first attachment plate is attached to the first engagement portion, and the first spacer supports the holding portion, and is attached to the first attachment plate at a different position from the first engagement portion as viewed in a gravitational direction. The second attachment plate is attached to the second engagement portion, and the second spacer supports the holding portion, and is attached to the second attachment plate at a different position from the second engagement portion as viewed in the gravitational direction.

In an embodiment, the conveying apparatus further includes a first bearing located between the first engagement portion and the guide mechanism, and a second bearing located between the second engagement portion and the guide mechanism.

In an embodiment, the conveying apparatus further includes a base that supports the guide mechanism, where a first cant surface is provided between the first engagement portion and the holding portion, or between the guide mechanism and the base, and a second cant surface is provided between the second engagement portion and the holding portion, or between the guide mechanism and the base.

In an embodiment, the conveying apparatus further includes a base that supports the guide mechanism, where a first step portion is provided between the first engagement portion and the holding portion, or between the guide mechanism and the base, and a second step portion is provided between the second engagement portion and the holding portion, or between the guide mechanism and the base.

In an embodiment, the holding portion has a holder and an end effector that holds the workpiece, where the holder is supported by the first support and the second support, and the end effector is connected to the holder, and extends in the first direction.

A second aspect of the present invention provides a conveying system including a conveying apparatus provided by the first aspect noted above and a workpiece housing mechanism that houses a workpiece conveyed by the conveying apparatus.

Other features and advantages of the present invention will become apparent from the detailed description given below with reference to the accompanying drawings.

DESCRIPTION OF THE PREFERRED EMBODIMENTS

Hereinafter, embodiments of the present invention will be described in detail with reference to the drawings.

A first embodiment of the present invention will be described below with reference to FIGS. 1 to 4.

Figure 1:
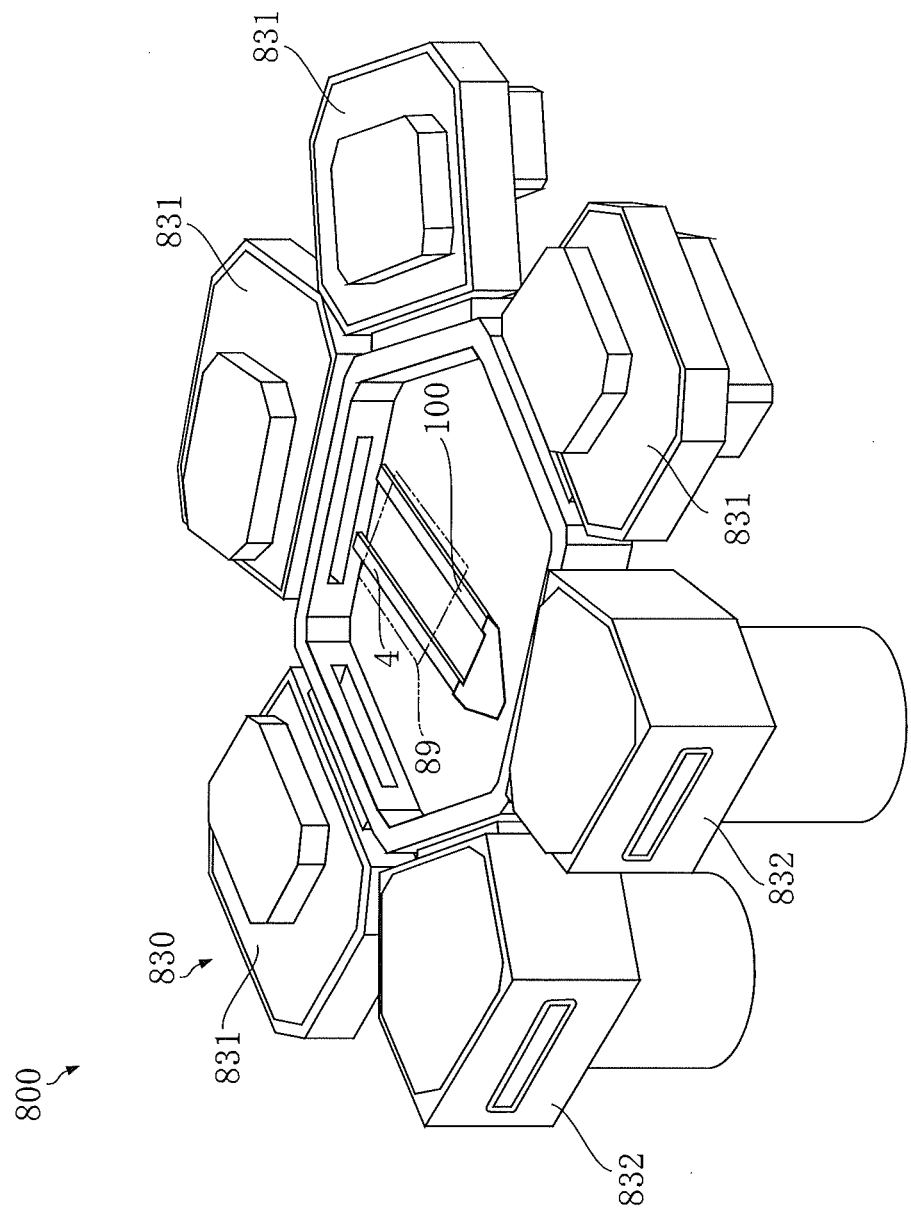
FIG. 1 is a perspective view of a conveying system according to a first embodiment of the present invention.

FIG. 1 is a perspective view of a conveying system according to the first embodiment of the present invention.

A conveying system 800 shown in this figure includes a conveying apparatus 100 (a portion of the configuration thereof is not shown in FIG. 1) and a workpiece housing mechanism 830.

The conveying apparatus 100 is a conveying robot for conveying a workpiece 89. The workpiece 89 is plate-shaped, and is a glass panel or a liquid crystal FPD substrate, for example.

The workpiece housing mechanism 830 is a mechanism for housing the workpiece 89. In the present embodiment, the workpiece housing mechanism 830 includes multiple workpiece storage apparatuses 831 and 832.

The workpiece storage apparatuses 831 are each for storing a workpiece 89. In the present embodiment, the workpiece storage apparatuses 831 (there are four of them) are each a chamber. More specifically, the workpiece storage apparatuses 831 are each a process chamber. Processing such as CVD (Chemical Vapor Deposition) or etching is performed on the workpiece 89 in each process chamber. The workpiece storage apparatuses 832 (there are two of them) are each a load lock chamber. A load lock chamber is a vacuum chamber installed for the transfer of a workpiece 89 before/after processing in a process chamber, in order to keep the interior of the process chamber in a vacuum state and not open it to the atmosphere.

Figure 2:
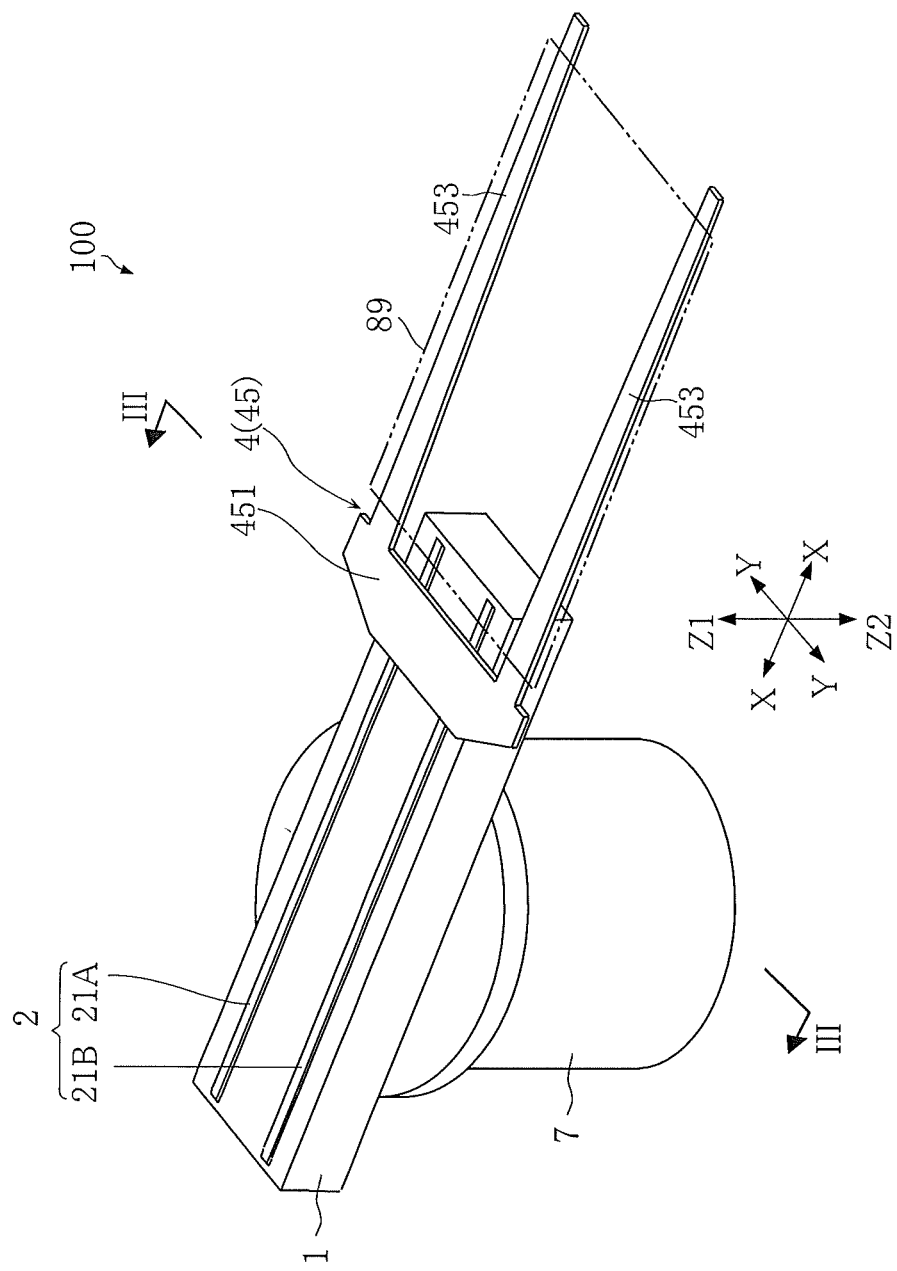
FIG. 2 is a perspective view of a conveying apparatus according to the first embodiment of the present invention.
Figure 3:
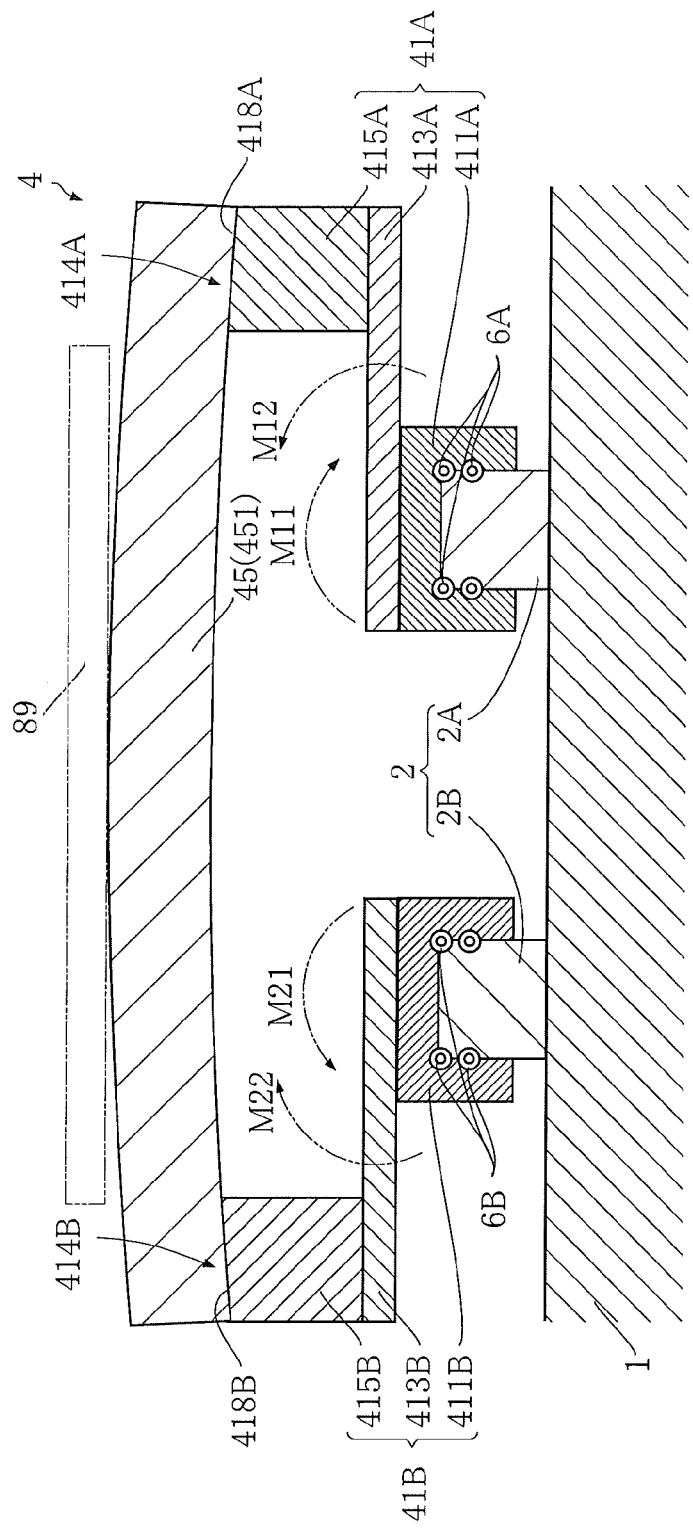
FIG. 3 is a cross-sectional diagram schematically showing a cross-section taken along line in FIG. 2.

FIG. 2 is a perspective view of the conveying apparatus according to the first embodiment of the present invention. FIG. 3 is a cross-sectional diagram schematically showing a cross-section taken along line in FIG. 2. Note that in the present embodiment, a direction Z1 faces upward vertically or in the gravitational direction, and a direction Z2 faces downward in the gravitational direction.

The conveying apparatus 100 shown in FIGS. 2 and 3 includes a base 1, a guide mechanism 2, a moving body 4, a first bearing 6A, a second bearing 6B, and a trunk 7.

The base 1 is supported by the trunk 7. The base 1 is made of a metal, for example.

The guide mechanism 2 is for guiding movement of the moving body 4. The guide mechanism 2 is supported by and fixed to the base 1. In the present embodiment, the guide mechanism 2 has a first guide portion 2A and a second guide portion 2B. The first guide portion 2A and the second guide portion 2B each extend along a first direction X. The first guide portion 2A and the second guide portion 2B are separated from each other in a second direction Y that is orthogonal to the first direction X. The first guide portion 2A and the second guide portion 2B are supported by and fixed to the base 1. In the present embodiment, the first guide portion 2A and the second guide portion 2B are linear guide rails.

The moving body 4 moves relative to the trunk 7 by being moved by a movement mechanism (not shown). The moving body 4 is guided by the guide mechanism 2 when moving in the first direction X. Specifically, the moving body 4 is guided by the first guide portion 2A and the second guide portion 2B as it moves. Also, the moving body 4 is capable of being rotated relative to the trunk 7 by arms, a rotation mechanism (not described in detail), or the like. The moving body 4 has a function of holding the workpiece 89.

As shown in FIG. 3, the moving body 4 includes a first support 41A, a second support 41B, and a holding portion 45.

The holding portion 45 shown in FIGS. 2 and 3 is for holding the workpiece 89. The holding portion 45 is supported by the first support 41A and the second support 41B in the state of spanning the first support 41A and the second support 41B. The holding portion 45 moves while holding the workpiece 89, and thus the workpiece 89 is conveyed to a desired position. In the present embodiment, the workpiece 89 is conveyed by being placed on the holding portion 45. In contrast to the present embodiment, a configuration is possible in which the workpiece 89 is not placed on the holding portion 45. For example, the holding portion 45 may hold the workpiece 89 by adsorption of the workpiece 89 from the upper surface of the workpiece 89. The holding portion 45 is constituted by a rigid body. For example, this rigid body is made of a metal such as stainless steel, aluminum, or iron.

As shown in FIG. 2, in the present embodiment, the holding portion 45 has a holder 451 and two end effectors 453. The holder 451 is coupled to a movement mechanism (not shown). The end effectors 453 are shaped as thin plates that extend in one direction. The end effectors 453 are connected to the holder 451. The workpiece 89 is placed on the two end effectors 453, and thus the workpiece 89 is conveyed.

The first support 41A is supported by the guide mechanism 2 so as to be capable of moving in the first direction X. In the present embodiment, the first support 41A is supported by the first guide portion 2A so as to be capable of moving in the first direction X. As described above, the first support 41A supports the holding portion 45. As viewed in the gravitational direction, or more specifically, in a view from above in the gravitational direction to below, a support region 414A of the first support 41A for supporting the holding portion 45 is located at a different position from a first engagement portion 411A (described later). In the present embodiment, in a view from above in the gravitational direction to below, the support region 414A is located outward of the region sandwiched by the first guide portion 2A and the second guide portion 2B. In contrast to the present embodiment, in a view from above in the gravitational direction to below, the support region 414A may be located inside the region sandwiched by the first guide portion 2A and the second guide portion 2B.

The first support 41A is constituted by a rigid body. For example, this rigid body is made of a metal such as stainless steel, aluminum, or iron. The holding portion 45 is attached to the first support 41A, and thus the first support 41A and the holding portion 45 are fixed to each other. The first support 41A and the holding portion 45 may be fixed to each other using a bolt or welding, for example.

The first support 41A has a first engagement portion 411A, a first attachment plate 413A, and a first spacer 415A.

The first engagement portion 411A is engaged with the guide mechanism 2. In the present embodiment, the first engagement portion 411A is engaged with the first guide portion 2A. In the state in which the first engagement portion 411A and the guide mechanism 2 are engaged, the first engagement portion 411A moves in the first direction X, and thus the moving body 4 moves in the first direction X. In the present embodiment, the first engagement portion 411A is a linear guide block.

The first attachment plate 413A is attached to the first engagement portion 411A. In the present embodiment, a portion of the first attachment plate 413A on the base side is attached to the first engagement portion 411A. The first attachment plate 413A may be attached to the first engagement portion 411A using a bolt, for example. In the present embodiment, the tip side of the first attachment plate 413A is located in a direction away from a second engagement portion 411B (described later).

The first spacer 415A supports the holding portion 45, and is attached to the first attachment plate 413A at a different position from the first engagement portion 411A in a view from above in the gravitational direction to below. For example, in the present embodiment, the first spacer 415A is attached to a portion of the first attachment plate 413A on the tip side.

The second support 41B is supported by the guide mechanism 2 so as to be capable of moving in the first direction X. In the present embodiment, the second support 41B is supported by the second guide portion 2B so as to be capable of moving in the first direction X. As described above, the second support 41B supports the holding portion 45. In a view from above in the gravitational direction to below, a support region 414B of the second support 41B for supporting the holding portion 45 is located at a different position from a second engagement portion 411B (described later). In the present embodiment, in a view from above in the gravitational direction to below, the support region 414B is located outward of the region sandwiched by the first guide portion 2A and the second guide portion 2B. In contrast to the present embodiment, in a view from above in the gravitational direction to below, the support region 414B may be located inside the region sandwiched by the first guide portion 2A and the second guide portion 2B.

The second support 41B is constituted by a rigid body. For example, this rigid body is made of a metal such as stainless steel, aluminum, or iron. The holding portion 45 is attached to the second support 41B, and thus the second support 41B and the holding portion 45 are fixed to each other. The second support 41B and the holding portion 45 may be fixed to each other using a bolt or welding, for example.

The second support 41B has a second engagement portion 411B, a second attachment plate 413B, and a second spacer 415B.

The second engagement portion 411B is engaged with the guide mechanism 2. In the present embodiment, the second engagement portion 411B is engaged with the second guide portion 2B. In the state in which the second engagement portion 411B and the guide mechanism 2 are engaged, the second engagement portion 411B moves in the first direction X, and thus the moving body 4 moves in the first direction X. In the present embodiment, the second engagement portion 411B is a linear guide block.

The second attachment plate 413B is attached to the second engagement portion 411B. In the present embodiment, a portion of the second attachment plate 413B on the base side is attached to the second engagement portion 411B. The second attachment plate 413B may be attached to the second engagement portion 411B using a bolt, for example. In the present embodiment, the tip side of the second attachment plate 413B is located in a direction away from the first engagement portion 411A.

The second spacer 415B supports the holding portion 45, and is attached to the second attachment plate 413B at a different position from the second engagement portion 411B in a view from above in the gravitational direction to below. For example, in the present embodiment, the second spacer 415B is attached to a portion of the second attachment plate 413B on, the tip side.

Figure 4:
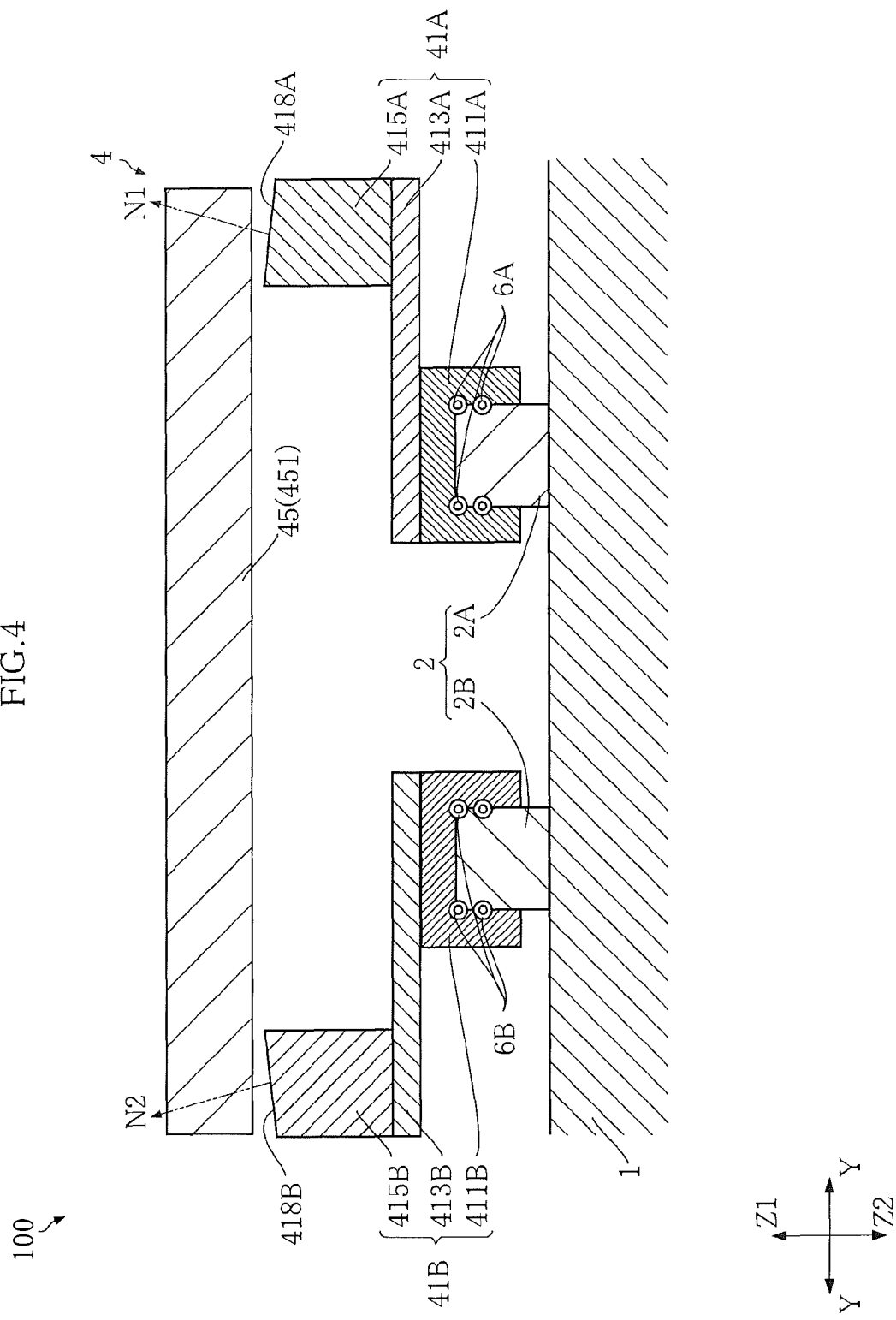
FIG. 4 is a cross-sectional diagram showing a step in a manufacturing process for the conveying apparatus shown in FIG. 3.

In the conveying apparatus 100, a first cant surface 418A is formed between the first engagement portion 411A and the holding portion 45. In the present embodiment, the first cant surface 418A is formed on the first spacer 415A of the first support 41A. FIG. 4 is a cross-sectional diagram showing a step in a manufacturing process for the conveying apparatus 100 shown in FIG. 3. As shown in this figure, the first cant surface 418A is inclined relative to the top surface of the first engagement portion 411A before the holding portion 45 is fixed to the first support 41A. In the present embodiment, the first cant surface 418A is inclined relative to the top surface of the first engagement portion 411A such that a direction N1 extending along the normal line of the first cant surface 418A faces the side opposite to the side on which the second engagement portion 411B is located. The inclination of the first cant surface 418A relative to the top surface of the first engagement portion 411A is $1/100$ to $5/100$, for example.

Similarly, in the conveying apparatus 100, a second cant surface 418B is formed between the second engagement portion 411B and the holding portion 45. In the present embodiment, the second cant surface 418B is formed on the second spacer 415B of the second support 41B. As shown in FIG. 4, the second cant surface 418B is inclined relative to the top surface of the second engagement portion 411B before the holding portion 45 is fixed to the second support 41B. In the present embodiment, the second cant surface 418B is inclined relative to the top surface of the second engagement portion 411B such that a direction N2 extending along the normal line of the second cant surface 418B faces the side opposite to the side on which the first engagement portion 411A is located. The inclination of the second cant surface 418B relative to the top surface of the second engagement portion 411B is $1/100$ to $5/100$, for example.

As shown in FIG. 3, when the workpiece 89 is supported by the holding portion 45 during use of the conveying apparatus 100, a moment M11 is applied to the first engagement portion 411A by the load of the workpiece 89. Similarly, when the workpiece 89 is supported by the holding portion 45 during use of the conveying apparatus 100, a moment M21 is applied to the second engagement portion 411B by the load of the workpiece 89.

Due to the first cant surface 418A and the second cant surface 418B being formed in the conveying apparatus 100, the moving body 4 (first support 41A, second support 41B, and holding portion 45) is held in an elastically deformed state (the elastically deformed state of the moving body 4 is shown in an exaggerated manner in FIG. 3). For example, the holding portion 45 is held in an elastically deformed state of being curved upward (to a very small degree) in the gravitational direction. Accordingly, a first opposite direction moment M12 is applied to the first engagement portion 411A by the deformation of the moving body 4. The first opposite direction moment M12 is a moment in the direction opposite to the aforementioned moment M11. Similarly, a second opposite direction moment M22 is applied to the second engagement portion 411B by the deformation of the moving body 4. The second opposite direction moment M22 is a moment in the direction opposite to the aforementioned moment M21.

The first bearing 6A is located between the first engagement portion 411A and the guide mechanism 2. Specifically, the first bearing 6A is located between the first engagement portion 411A and the first guide portion 2A. Similarly, the second bearing 6B is located between the second engagement portion 411B and the guide mechanism 2. Specifically, the second bearing 6B is located between the second engagement portion 411B and the second guide portion 2B. Note that the conveying apparatus 100 is not necessarily required to include the first bearing 6A and the second bearing 6B.

Next, operation effects of the present embodiment will be described.

In the present embodiment, the first opposite direction moment M12 is applied to the first engagement portion 411A by the deformation of the moving body 4. The first opposite direction moment M12 is a moment in the direction opposite to the moment M11 that is applied to the first engagement portion 411A by the load of the workpiece 89 when the workpiece 89 is held by the holding portion 45. According to this configuration, the first opposite direction moment M12 is a moment in the direction opposite to the moment M11, thus making it possible to reduce the load applied to the first engagement portion 411A by the moment. This enables preventing damage to the first engagement portion 411A, and makes it possible to extend the lifetime of the conveying apparatus 100.

Similarly, in the present embodiment, the second opposite direction moment M22 is applied to the second engagement portion 411B by the deformation of the moving body 4. The second opposite direction moment M22 is a moment in the direction opposite to the moment M21 that is applied to the second engagement portion 411B by the load of the workpiece 89 when the workpiece 89 is held by the holding portion 45. According to this configuration, the second opposite direction moment M22 is a moment in the direction opposite to the moment M21, thus making it possible to reduce the load applied to the second engagement portion 411B by the moment. This enables preventing damage to the second engagement portion 411B, and makes it possible to extend the lifetime of the conveying apparatus 100.

If the load applied to the first engagement portion 411A and the second engagement portion 411B by the moments can be reduced, it is possible to ensure the load bearing characteristic of the conveying apparatus 100, and the distance between the first guide portion 2A and the second guide portion 2B can be determined more freely. Accordingly, it is possible to realize a small conveying apparatus 100 having a relatively short distance between the first guide portion 2A and the second guide portion 2B, as in the present embodiment for example. Alternatively, in contrast to the present embodiment, it is possible to apply a configuration in which the support regions 414A and 414B are located in the region sandwiched by the first guide portion 2A and the second guide portion 2B, and the distance between the first guide portion 2A and the second guide portion 2B is relatively long.

If the load applied to the first engagement portion 411A and the second engagement portion 411B by the moments can be reduced, it is possible to prevent load from being locally applied to the first bearing 6A and the second bearing 6B. Accordingly, flaking can be prevented, and it is possible to extend the lifetime of the first bearing 6A and the second bearing 6B.

A first variation of the first embodiment of the present invention will be described below with reference to FIGS. 5 and 6.

Note that in the following description, configurations that are the same as or similar to configurations in the above description will be denoted by the same reference numbers as above, and descriptions thereof will be omitted as appropriate.

Figure 5:
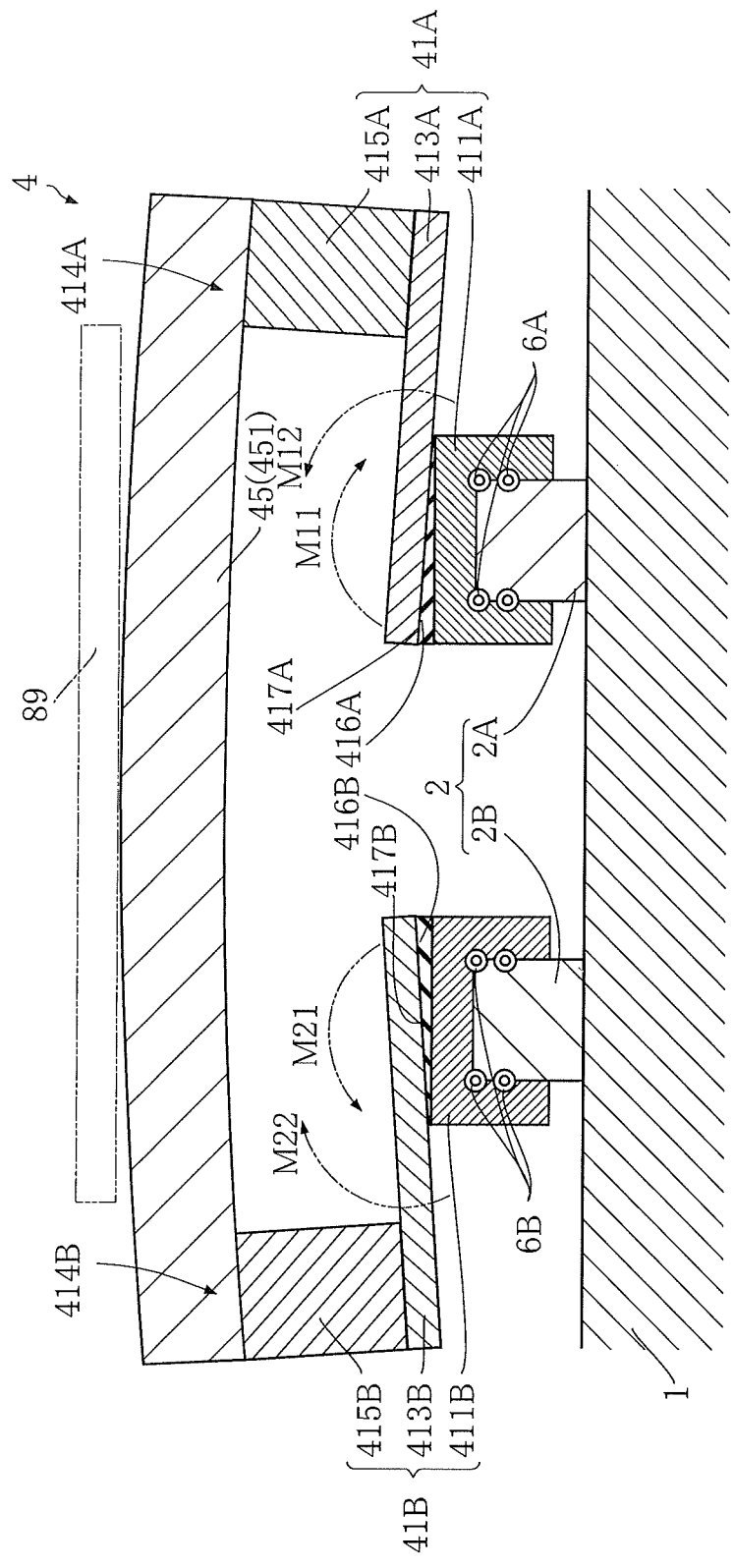
FIG. 5 is a cross-sectional diagram schematically showing a conveying apparatus according to a first variation of the first embodiment of the present invention.
Figure 6:
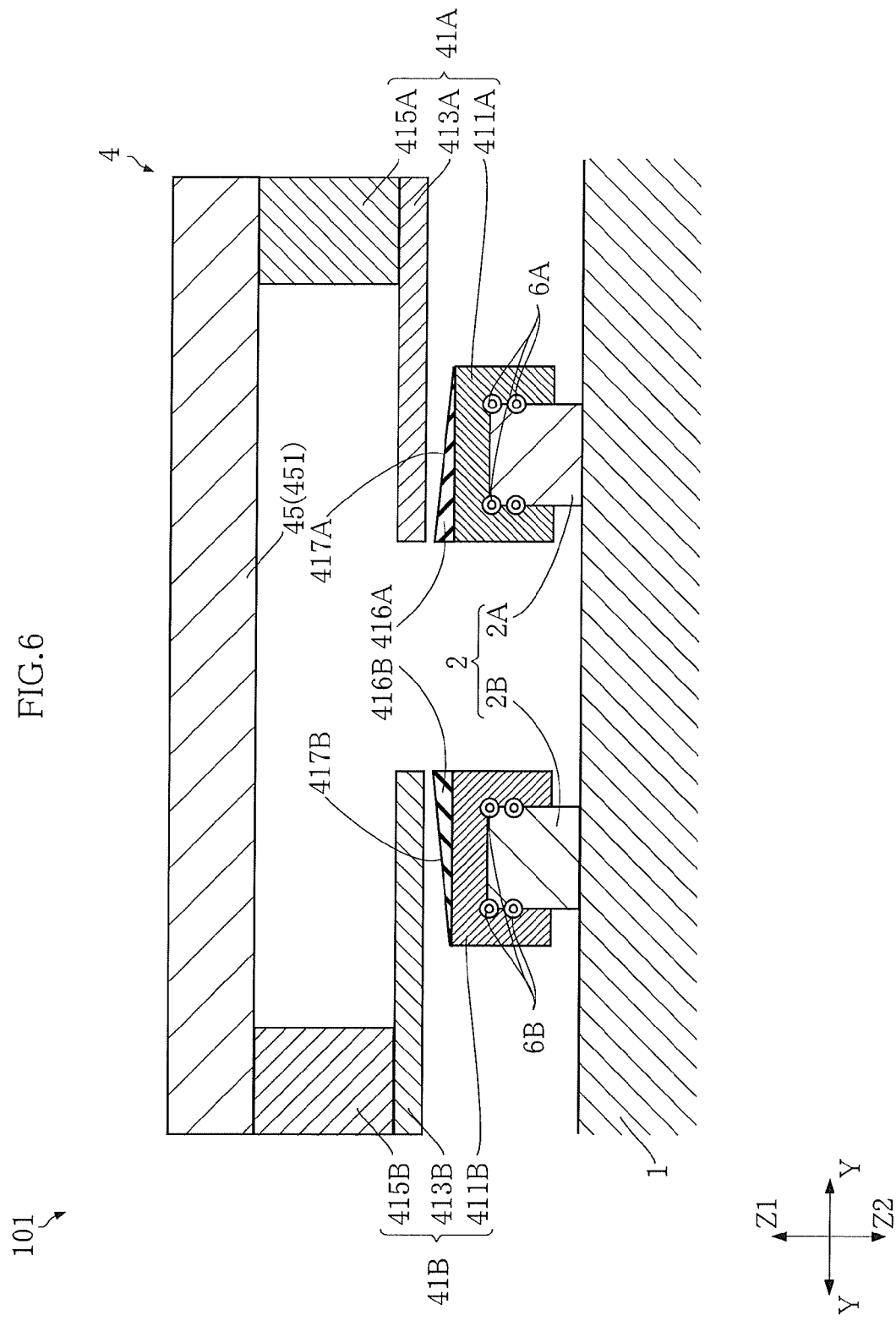
FIG. 6 is a cross-sectional diagram showing a step in a manufacturing process for the conveying apparatus shown in FIG. 5.

FIG. 5 is a cross-sectional diagram schematically showing a conveying apparatus according to the first variation of the first embodiment of the present invention. FIG. 6 is a cross-sectional diagram showing a step in a manufacturing process for the conveying apparatus shown in FIG. 5.

In a conveying apparatus 101 of the present variation, the first cant surface 418A is not formed on the first spacer 415A, and a first cant surface 417A is formed on a first intermediate member 416A that is provided between the first engagement portion 411A and the first attachment plate 413A. Similarly, the second cant surface 418B is not formed on the second spacer 415B, and a second cant surface 417B is formed on a second intermediate member 416B that is provided between the second engagement portion 411B and the second attachment plate 413B.

Due to the first cant surface 417A and the second cant surface 417B being formed in the conveying apparatus 101, the moving body 4 (first support 41A, second support 41B, and holding portion 45) is held in an elastically deformed state (the elastically deformed state of the moving body 4 is shown in an exaggerated manner in FIG. 5). For example, the holding portion 45 is held in an elastically deformed state of being curved upward (to a very small degree) in the gravitational direction. Accordingly, the first opposite direction moment M12 is applied to the first engagement portion 411A by the deformation of the moving body 4. The first opposite direction moment M12 is a moment in the direction opposite to the aforementioned moment M11. Similarly, the second opposite direction moment M22 is applied to the second engagement portion 411B by the deformation of the moving body 4. The second opposite direction moment M22 is a moment in the direction opposite to the aforementioned moment M21.

The present variation also has operation effects similar to the operation effects described in connection with the conveying apparatus 100.

A second variation of the first embodiment of the present invention will be described below with reference to FIGS. 7 and 8.

Figure 7:
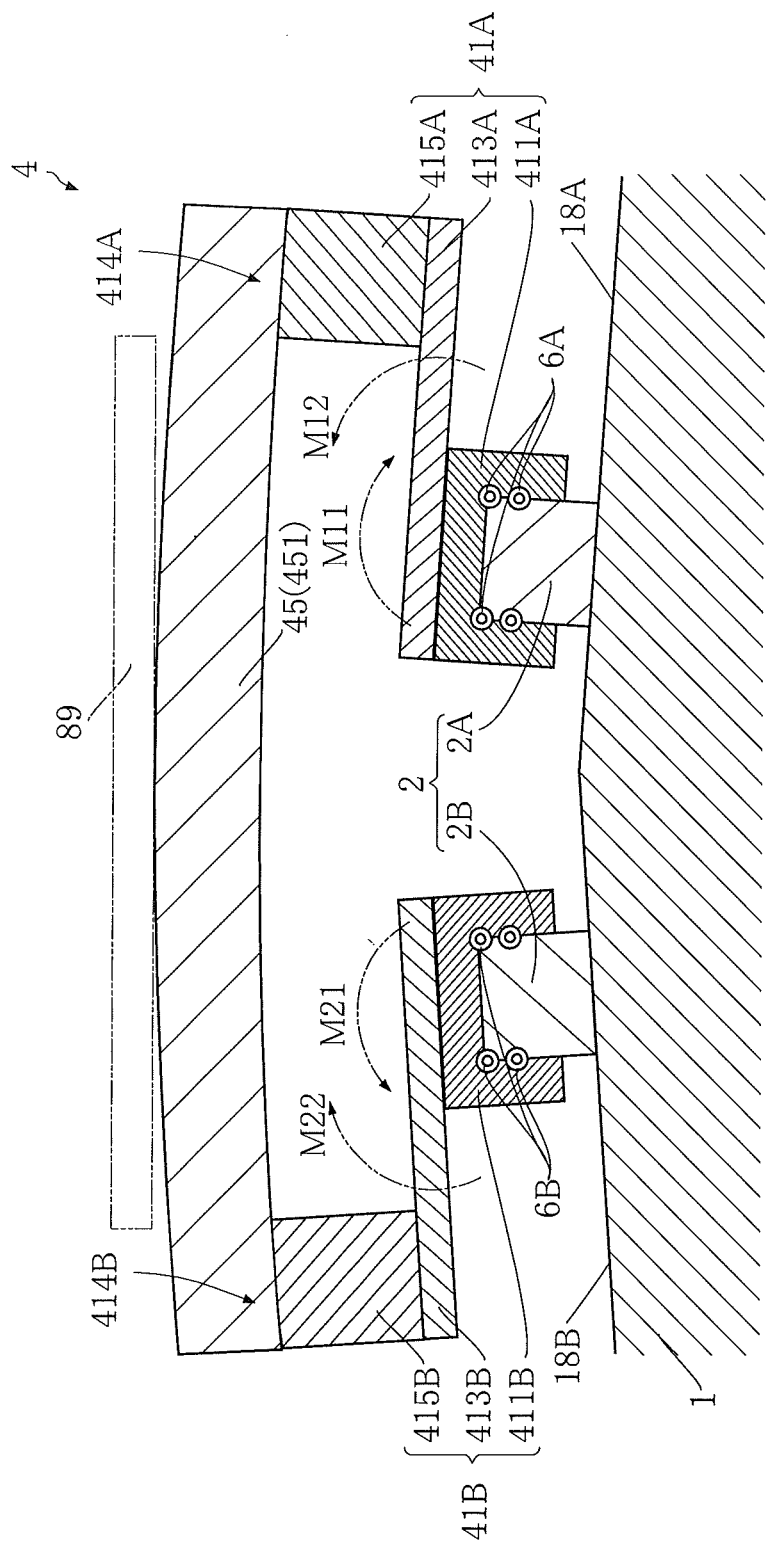
FIG. 7 is a cross-sectional diagram schematically showing a conveying apparatus according to a second variation of the first embodiment of the present invention.
Figure 8:
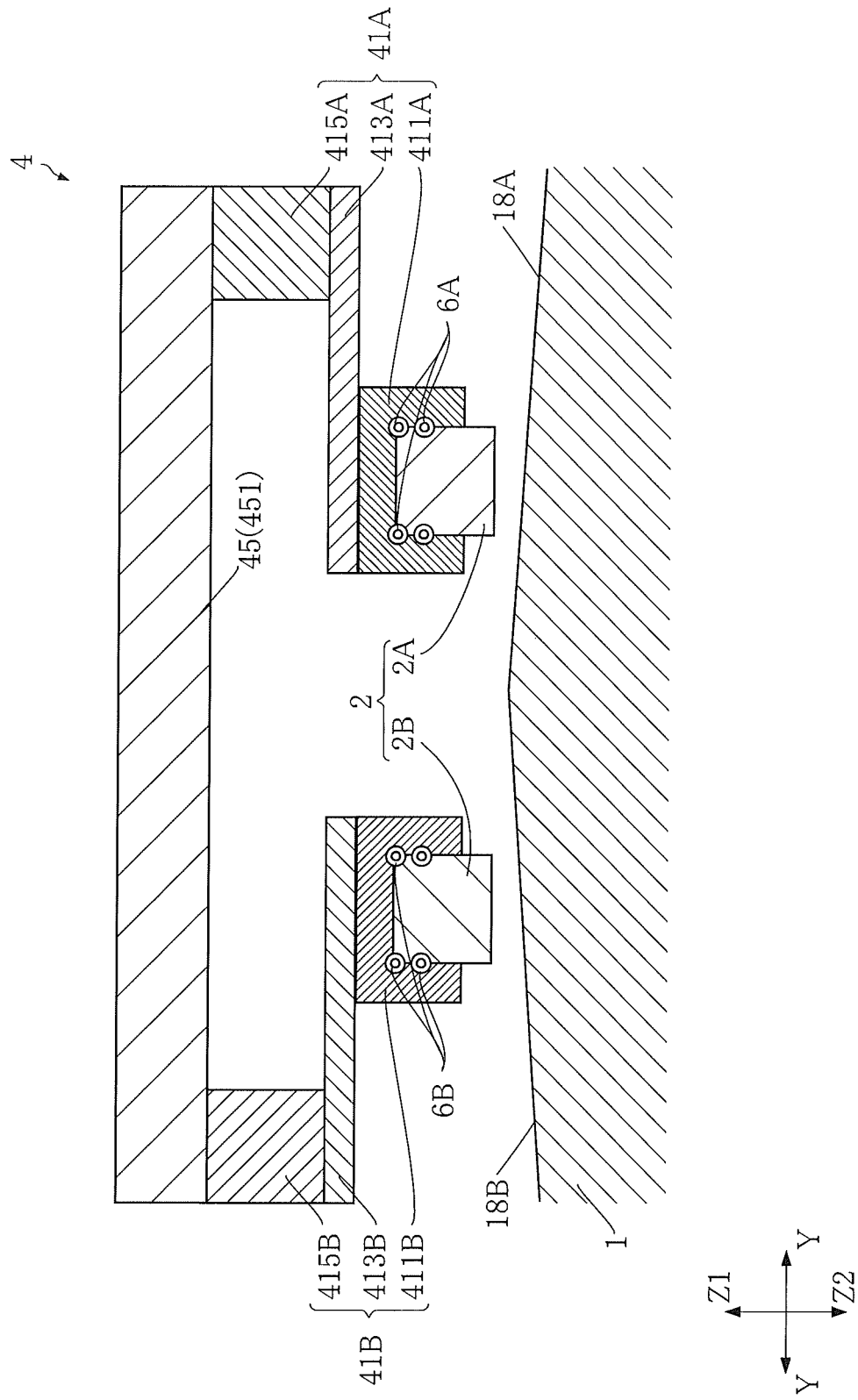
FIG. 8 is a cross-sectional diagram showing a step in a manufacturing process for the conveying apparatus shown in FIG. 7.

FIG. 7 is a cross-sectional diagram schematically showing a conveying apparatus according to the second variation of the first embodiment of the present invention. FIG. 8 is a cross-sectional diagram showing a step in a manufacturing process for the conveying apparatus shown in FIG. 7.

In a conveying apparatus 102 of the present variation, the first cant surface 418A is not formed on the first spacer 415A, and a first cant surface 18A is formed on the base 1. Specifically, in this case, the first cant surface 18A is formed between the guide mechanism 2 and the base 1. Similarly, the second cant surface 418B is not formed on the second spacer 415B, and a second cant surface 18B is formed on the base 1. Specifically, in this case, the second cant surface 18B is formed between the guide mechanism 2 and the base 1.

Due to the first cant surface 18A and the second cant surface 18B being formed in the conveying apparatus 102, the moving body 4 (first support 41A, second support 41B, and holding portion 45) is held in an elastically deformed state (the elastically deformed state of the moving body 4 is shown in an exaggerated manner in FIG. 7). For example, the holding portion 45 is held in an elastically deformed state of being curved upward (to a very small degree) in the gravitational direction. Accordingly, the first opposite direction moment M12 is applied to the first engagement portion 411A by the deformation of the moving body 4. The first opposite direction moment M12 is a moment in the direction opposite to the aforementioned moment M11. Similarly, the second opposite direction moment M22 is applied to the second engagement portion 411B by the deformation of the moving body 4. The second opposite direction moment M22 is a moment in the direction opposite to the aforementioned moment M21.

The present variation also has operation effects similar to the operation effects described in connection with the conveying apparatus 100.

A third variation of the first embodiment of the present invention will be described below with reference to FIG. 9.

Figure 9:
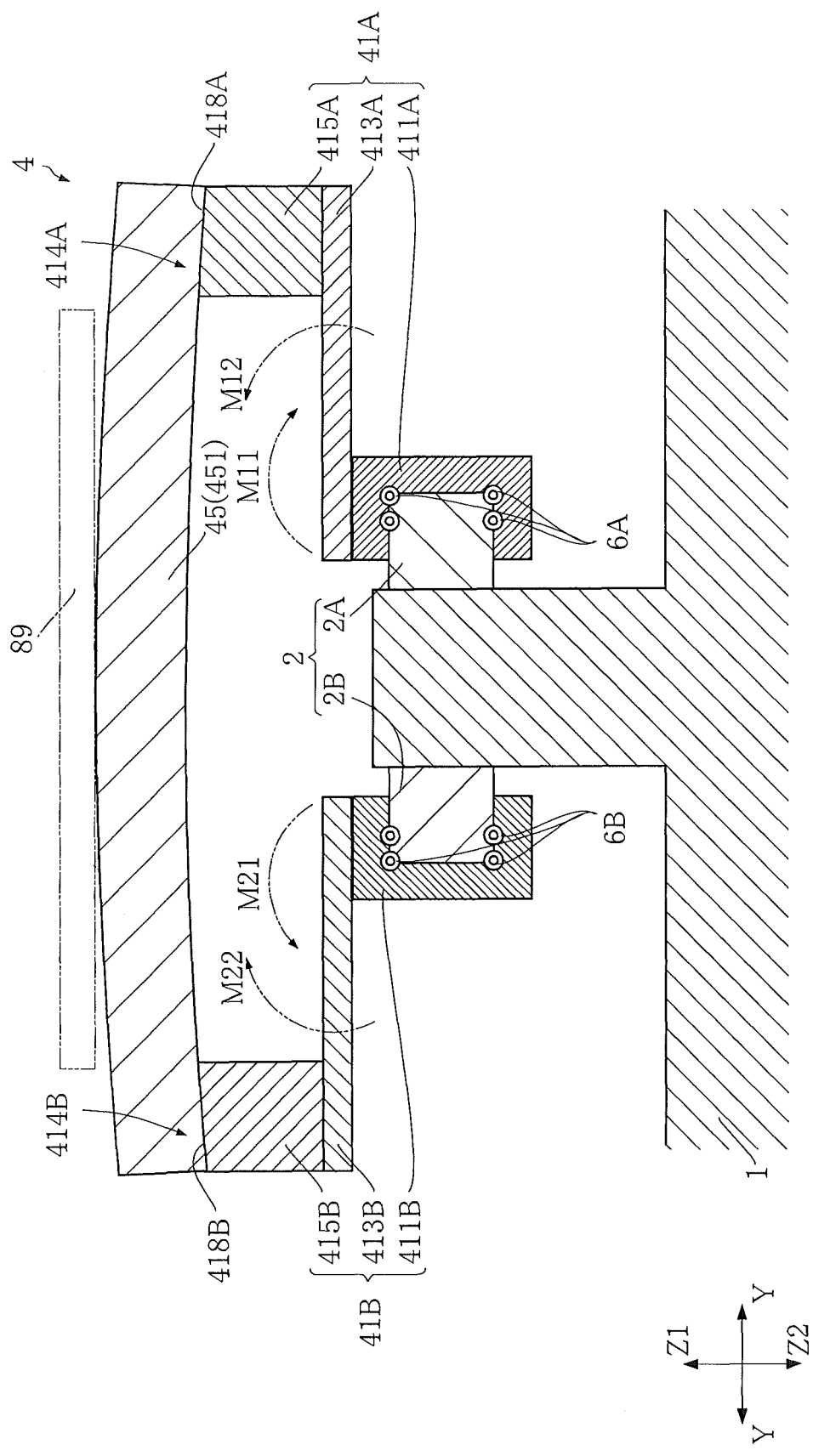
FIG. 9 is a cross-sectional diagram schematically showing a conveying apparatus according to a third variation of the first embodiment of the present invention.

FIG. 9 is a cross-sectional diagram schematically showing a conveying apparatus according to the third variation of the first embodiment of the present invention.

In a conveying apparatus 103 of the present variation, the positional relationship that the first support 41A (first engagement portion 411A) has with the first guide portion 2A and the positional relationship that the second support 41B (second engagement portion 411B) has with the second guide portion 2B are different from the conveying apparatus 100. This configuration also has operation effects similar to the operation effects described in connection with the conveying apparatus 100.

A fourth variation of the first embodiment of the present invention will be described below with reference to FIG. 10.

Figure 10:
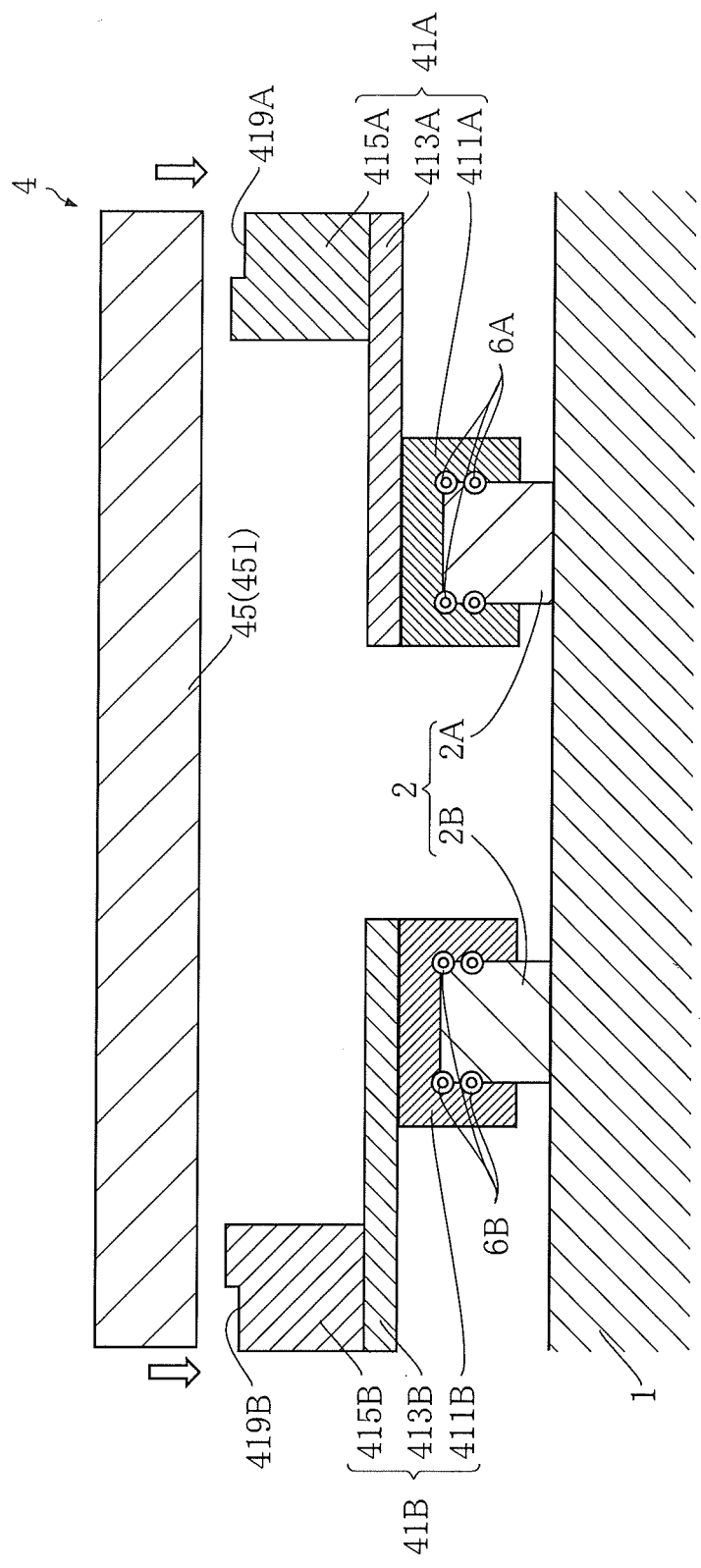
FIG. 10 is a cross-sectional diagram schematically showing a step in a manufacturing processing for a conveying apparatus according to a fourth variation of the first embodiment of the present invention.

FIG. 10 is a cross-sectional diagram schematically showing a step in a manufacturing processing for a conveying apparatus according to the fourth variation of the first embodiment of the present invention.

In a conveying apparatus 104 of the present variation, the first cant surface 418A is not formed on the first spacer 415A, and a first step portion 419A is formed in the first spacer 415A. Similarly, the second cant surface 418B is not formed on the second spacer 415B, and a second step portion 419B is formed in the second spacer 415B. In the present variation, the first step portion 419A is formed in one member (the first spacer 415A), but the method of forming the step portion is not limited to this. For example, the aforementioned first step portion 419A may be formed using multiple members (e.g., multiple shims). The same follows with the second step portion 419B as well.

By forming the first step portion 419A and the second step portion 419B in the conveying apparatus 104, the moving body 4 (first support 41A, second support 41B, and holding portion 45) is held in an elastically deformed state. Accordingly, the first opposite direction moment M12 (not shown in the present variation, and therefore see FIG. 3) is applied to the first engagement portion 411A by the deformation of the moving body 4. The first opposite direction moment M12 is a moment in the direction opposite to the aforementioned moment M11. Similarly, the second opposite direction moment M22 is applied to the second engagement portion 411B by the deformation of the moving body 4. The second opposite direction moment M22 (not shown in the present variation, and therefore see FIG. 3) is a moment in the direction opposite to the aforementioned moment M21.

The present variation also has operation effects similar to the operation effects described in connection with the conveying apparatus 100.

Note that although the example of providing step portions instead of cant surfaces is given as a variation of the conveying apparatus 100 in the present variation, step portions may be provided instead of cant surfaces in the conveying apparatus 101, the conveying apparatus 102, and the conveying apparatus 103.

A second embodiment of the present invention will be described below with reference to FIGS. 11 and 12.

Figure 11:
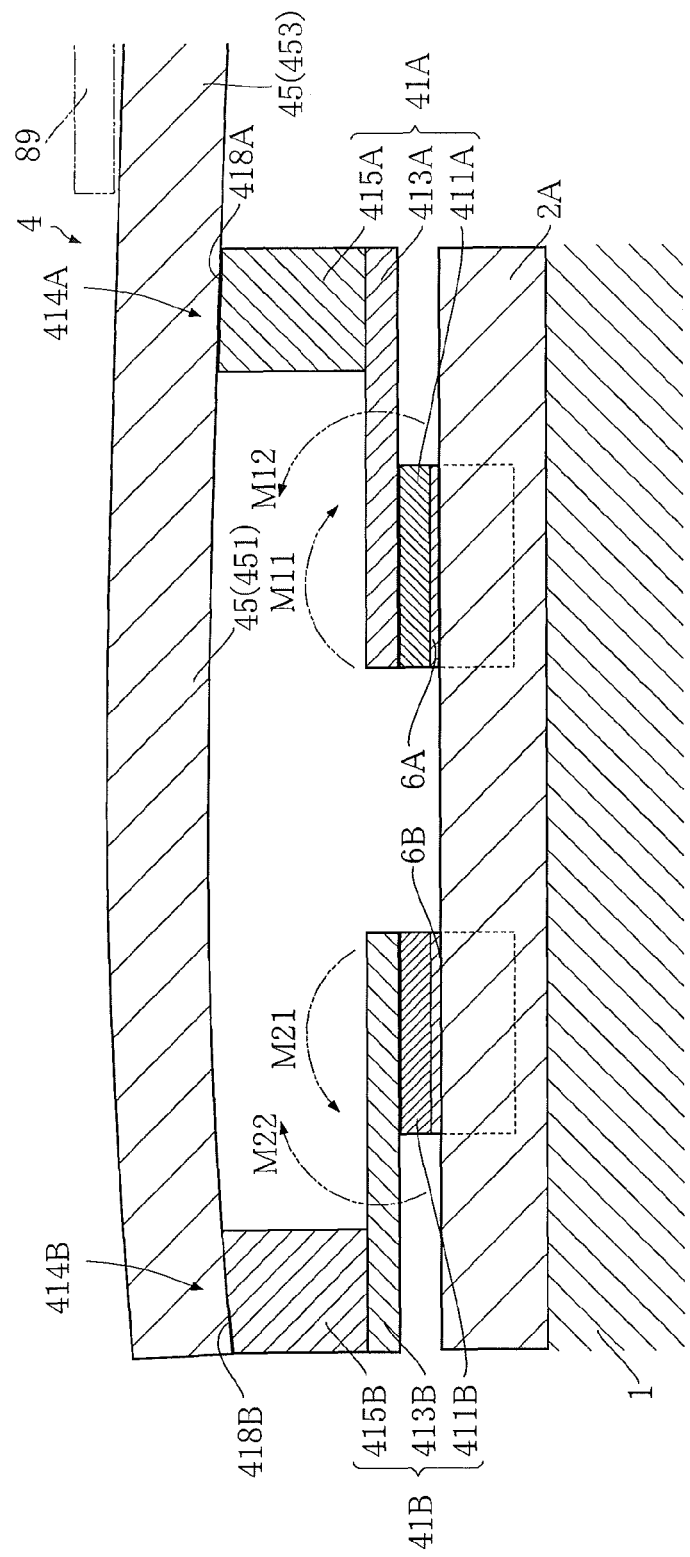
FIG. 11 is a cross-sectional diagram schematically showing a conveying apparatus according to a second embodiment of the present invention.
Figure 12:
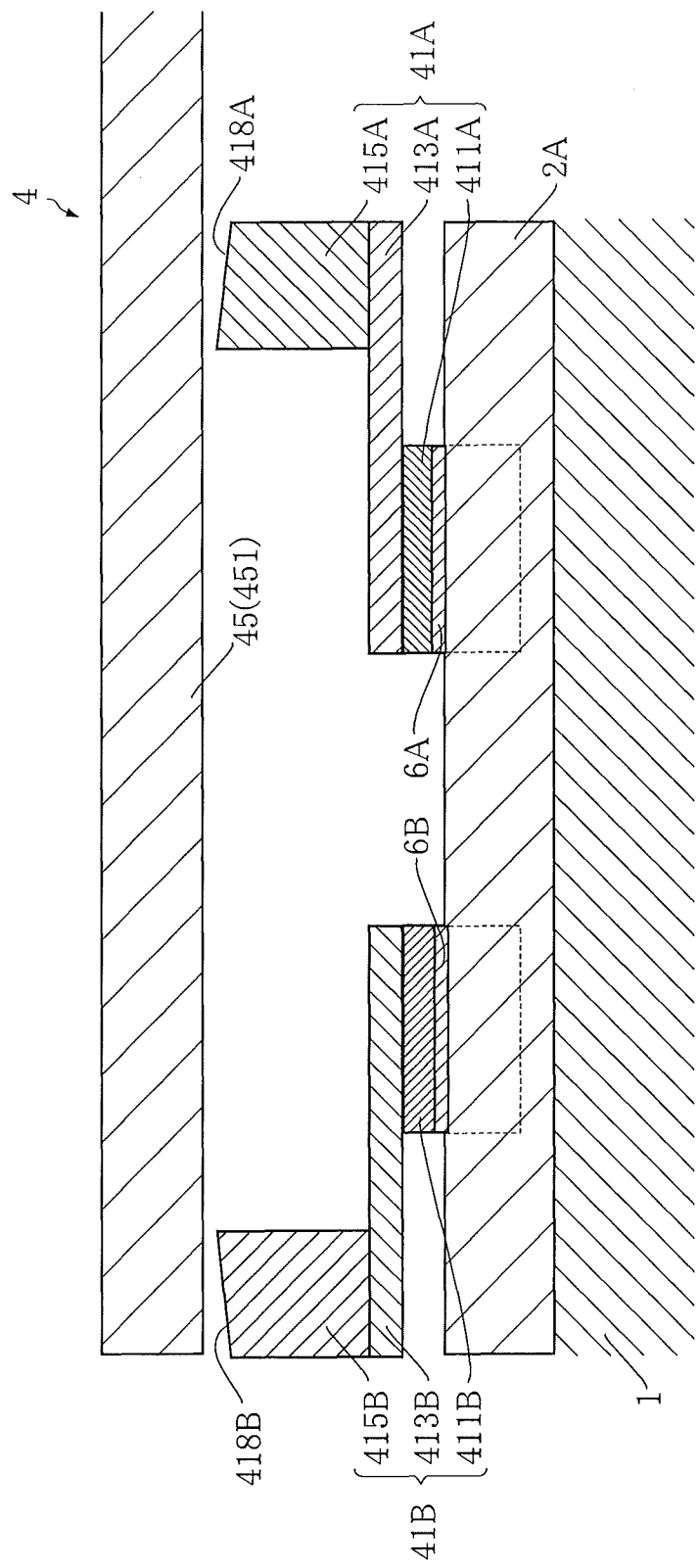
FIG. 12 is a cross-sectional diagram showing a step in a manufacturing process for the conveying apparatus shown in FIG. 11.

FIG. 11 is a cross-sectional diagram schematically showing a conveying apparatus according to the second embodiment of the present invention. FIG. 12 is a cross-sectional diagram showing a step in a manufacturing process for the conveying apparatus shown in FIG. 11.

A conveying apparatus 200 of the present embodiment differs from the above-described conveying apparatus 100 in that the first support 41A and the second support 41B are supported so as to be capable of moving in the first direction X relative to the same first guide portion 2A, and other aspects are similar to the conveying apparatus 100.

This configuration also has operation effects similar to the operation effects described in connection with the conveying apparatus 100. Note that although only two supports, namely the first support 41A and the second support 41B, are shown in FIG. 11, three or more supports may be provided. Also, in the present embodiment as well, the step portions described in connection with the conveying apparatus 104 may be provided instead of cant surfaces. Also, the configuration of the present embodiment may be combined with any of the configurations of the conveying apparatus 100, the conveying apparatus 101, the conveying apparatus 102, and the conveying apparatus 103. As yet another variation, a conveying apparatus may be provided with a combination of a cant surface described in connection with the conveying apparatus 100 and a step portion described in connection with the conveying apparatus 104.

The present invention is not limited to the embodiments described above. Various design modifications can be made to the specific configurations of the units of the present invention.

Although examples in which the guide mechanism includes two guide portions (rails in the above embodiments and variations) are described in the above embodiments, the present invention is not limited to this. For example, the guide mechanism may include three or more guide portions (e.g., rails).

Although examples of providing cant surfaces and/or step portions in order to generate the first opposite direction moment M12 and the second opposite direction moment M22 are described above, the present invention is not limited to this. For example, the first opposite direction moment M12 and the second opposite direction moment M22 may be generated by setting different heights for the first spacer 415A and the second spacer 415B shown in FIG. 3.

In contrast to the above embodiments and variations, the cant surfaces and/or step portions may be formed on the holding portion 45.

The invention claimed is:

1. A conveying apparatus comprising:
 a guide mechanism; and
 a moving body configured to move while being guided by the guide mechanism;
 wherein the moving body comprises: a first support including a first engagement portion engaged with the guide mechanism, the first support being supported by the guide mechanism so as to be capable of moving in a first direction; a second support including a second engagement portion engaged with the guide mechanism, the second support being supported by the guide mechanism so as to be capable of moving in the first direction; and a holding portion for holding a workpiece, the holding portion being supported by the first support and the second support,
 the first engagement portion receives a first opposite direction moment applied thereto by deformation of the moving body, the first opposite direction moment being opposite in direction to a moment applied to the first engagement portion by a load of the workpiece when the workpiece is held by the holding portion;
 a base supporting the guide mechanism, wherein a first cant surface is provided between the first engagement portion and the holding portion, or between the guide mechanism and the base, and
 a second cant surface is provided between the second engagement portion and the holding portion, or between the guide mechanism and the base,
 wherein the first and second cant surfaces have respective inner and outer heights;
 in plan view the inner height of one of the first and second cant surfaces is closer to the other inner height of the first and second cant surfaces than is the outer height of the one of the first and second cant surfaces, and
 the inner height is higher than the outer height.

2. The conveying apparatus according to claim 1, wherein a second opposite direction moment is applied to the second engagement portion by deformation of the moving body, the second opposite direction moment being opposite in direction to a moment applied to the second engagement portion by a load of the workpiece when the workpiece is held by the holding portion.

3. The conveying apparatus according to claim 1, wherein the moving body is held in an elastically deformed state.

4. The conveying apparatus according to claim 1, wherein the guide mechanism includes a first guide portion and a second guide portion each extending in the first direction, the first guide portion and the second guide portion being separated from each other in a second direction orthogonal to the first direction, and
 the first guide portion is engaged with the first engagement portion, and the second guide portion is engaged with the second engagement portion.

5. The conveying apparatus according to claim 1, wherein the first support has a first support region for supporting the holding portion, the first support region being located at a different position from the first engagement portion as viewed in a gravitational direction, and
 the second support has a second support region for supporting the holding portion, the second support region being located at a different position from the second engagement portion as viewed in the gravitational direction.

6. The conveying apparatus according to claim 1, wherein the holding portion includes a holder and an end effector that holds the workpiece,
 the holder is supported by the first support and the second support, and the end effector is connected to the holder and extends in the first direction.

7. The conveying apparatus according to claim 1, wherein the first support includes a first attachment plate and a first spacer, and the second support includes a second attachment plate and a second spacer,
 the first attachment plate is attached to the first engagement portion, and the first spacer supports the holding portion and is attached to the first attachment plate at a different position from the first engagement portion as viewed in a gravitational direction,
 the second attachment plate is attached to the second engagement portion, and the second spacer supports the holding portion and is attached to the second attachment plate at a different position from the second engagement portion as viewed in the gravitational direction.

8. The conveying apparatus according to claim 1, further comprising a first bearing and a second bearing, wherein the first bearing is located between the first engagement portion and the guide mechanism, and the second bearing is located between the second engagement portion and the guide mechanism.

9. A conveying system comprising:
 a conveying apparatus according to claim 1; and
 a workpiece housing mechanism that houses a workpiece conveyed by the conveying apparatus.

* * * * *